US008044695B2

(12) United States Patent
Miyazaki

(10) Patent No.: US 8,044,695 B2
(45) Date of Patent: Oct. 25, 2011

(54) SEMICONDUCTOR INTEGRATED CIRCUIT INCLUDING A MASTER-SLAVE FLIP-FLOP

(75) Inventor: Takayuki Miyazaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 61 days.

(21) Appl. No.: 12/484,743

(22) Filed: Jun. 15, 2009

(65) Prior Publication Data

US 2009/0309640 A1 Dec. 17, 2009

(30) Foreign Application Priority Data

Jun. 13, 2008 (JP) ................................ 2008-155113

(51) Int. Cl.
*H03K 3/356* (2006.01)

(52) U.S. Cl. ....................................... 327/203; 327/218

(58) Field of Classification Search ........................ None
See application file for complete search history.

(56) References Cited

U.S. PATENT DOCUMENTS

| | | | | |
|---|---|---|---|---|
| 6,437,623 | B1 * | 8/2002 | Hsu et al. | 327/202 |
| 6,624,677 | B1 | 9/2003 | Wissel | |
| 6,725,067 | B1 * | 4/2004 | Marx et al. | 455/574 |
| 7,332,949 | B2 * | 2/2008 | Kim | 327/202 |
| 7,596,737 | B2 * | 9/2009 | Wang et al. | 714/733 |

FOREIGN PATENT DOCUMENTS

| | | |
|---|---|---|
| JP | 60-213112 | 10/1985 |
| JP | 1-286609 | 11/1989 |
| JP | 10-335992 | 12/1998 |
| JP | 2006-115311 | 4/2006 |

OTHER PUBLICATIONS

Ashish Goel, et al., "Low-Overhead Design of Soft-Error-Tolerant Scan Flip-Flops with Enhanced-Scan Capability," 2006 IEEE, Asia and Smith Pacific Conference on Design Automation, pp. 665-670.

Japanese Office Action issued Nov. 9, 2010, in Patent Application No. 2008-155113 (with English-language translation).

W. J. Dally, et al., "Digital System Engineering Volume Basics", Mar. 30, 2003, pp. 354-356.

* cited by examiner

*Primary Examiner* — Lincoln Donovan
*Assistant Examiner* — Sibin Chen
(74) *Attorney, Agent, or Firm* — Oblon, Spivak, McClelland, Maier & Neustadt, L.L.P.

(57) ABSTRACT

A semiconductor integrated circuit having a flip-flop with improve soft error resistance, including a controller which controls a clock signal generating circuit to output a first clock signal and a second clock signal with a timing so that logic of data retained in a first data retaining terminal becomes identical to logic of data retained in a third data retaining terminal, and then turns on a first switching circuit to connect between the first data retaining terminal and the first data retaining terminal.

11 Claims, 13 Drawing Sheets

SEMICONDUCTOR INTEGRATED CIRCUIT INCLUDING A MASTER-SLAVE FLIP-FLOP

CROSS-REFERENCE TO RELATED APPLICATIONS

This application is based upon and claims the benefit of priority from the prior Japanese Patent Application No. 2008-155113, filed Jun. 13, 2008, the entire contents of which are incorporated herein by reference.

BACKGROUND OF THE INVENTION

1. Field of the Invention

The present invention relates to a semiconductor integrated circuit including a master-slave flip-flop.

2. Description of the Related Art

In recent years, micro-fabricated semiconductor integrated circuits have had a serious problem of soft errors caused by α rays and neutron rays that are generated by cosmic rays or radioactive isotope elements.

When α particles or neutrons are incident on such a semiconductor integrated circuit, charges are generated in a part of the semiconductor integrated circuit where the α rays or the neutron rays have been incident. These charges cause malfunction (soft error) of the semiconductor integrated circuit.

In particular, in flip-flops, when radiation is incident into anode in which data is retained, the retained data is inverted in some cases.

As a conventional method to solve this problem, memory circuits such as a static random access memory (SRAM) and a dynamic random access memory (DRAM) may employ a method of detecting and correcting the data inverted due to the soft error, by using an error correction code (ECC).

However, it is difficult to apply such a method to flip-flops.

For this reason, methods of improving soft error resistance of flip-flops have been devised. However, these methods need increased node capacity, or need to retain a copy of data, therefore leading to delay and increase in area of a memory circuit.

The memory circuit includes many flip-flops for storing setup information and redundancy information. The data in these flip-flops is constantly referred to when the memory circuit is operating. Moreover, the data in these flip-flops has higher importance than data that is stored in memory cells which needs to be appropriately corrected only when the data is read.

When a soft error occurs in the data in the flip-flops, the timing information and the redundancy information are destroyed. In this case, the circuit does not correctly operate as a memory circuit.

Therefore, in such conventional techniques, in order to get reliability of the memory circuit, a mechanism for detecting and correcting a soft error is needed.

SUMMARY OF THE INVENTION

An object of the present invention is to provide a semiconductor integrated circuit that can achieve improvement in soft error resistance of a flip-flop.

A semiconductor integrated circuit according to an embodiment according to one aspect of the present invention includes a data input terminal, a data output terminal, a master latch circuit having an input terminal connected to the data input terminal, a first data retaining terminal to retain logic of data inputted through the data input terminal, and a second data retaining terminal to retain inverted logic of the logic retained in the first data retaining terminal, a slave latch circuit having an input connected to an output terminal of the master latch circuit, an output terminal connected to the data output terminal, a third data retaining terminal to retain logic of the data inputted from the master latch circuit, and a fourth data retaining terminal to retain inverted logic of the logic retained in the third data retaining terminal, a clock signal generating circuit that generates and outputs a first clock signal to control operation of the master latch circuit and a second clock signal to control operation of the slave latch circuit, a first switching circuit connected between the first data retaining terminal and the third data retaining terminal, and a controller that controls the clock signal generating circuit and the first switching circuit, wherein the controller makes the clock signal generating circuit control the first clock signal and the second clock signal so that the logic of the data retained in the first data retaining terminal becomes identical to the logic of the data retained in the third data retaining terminal, and then turns on the first switching circuit.

A semiconductor integrated circuit according to an embodiment according to another aspect of the present invention includes a data input terminal, a data output terminal, a master latch circuit having an input terminal connected to the data input terminal, a first data retaining terminal to retain logic of data inputted through the data input terminal, and a second data retaining terminal to retain inverted logic of the logic retained in the first data retaining terminal, a slave latch circuit having an input terminal connected to an output of the master latch circuit, an output terminal connected to the data output terminal, a third data retaining terminal for retaining logic of the data inputted from the master latch circuit, and a fourth data retaining terminal for retaining inverted logic of the logic retained in the third data retaining terminal, a clock signal generating circuit that generates and outputs a first clock signal for controlling operation of the master latch circuit and a second clock signal for controlling operation of the slave latch circuit, a switching circuit connected between the second data retaining terminal and the fourth data retaining terminal, and a controller that controls the clock signal generating circuit and the switching circuit, wherein the controller makes the clock signal generating circuit control the first clock signal and the second clock signal so that the logic of the data retained in the second data retaining terminal becomes identical to the logic of the data retained in the fourth data retaining terminal, and then turns on the switching circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
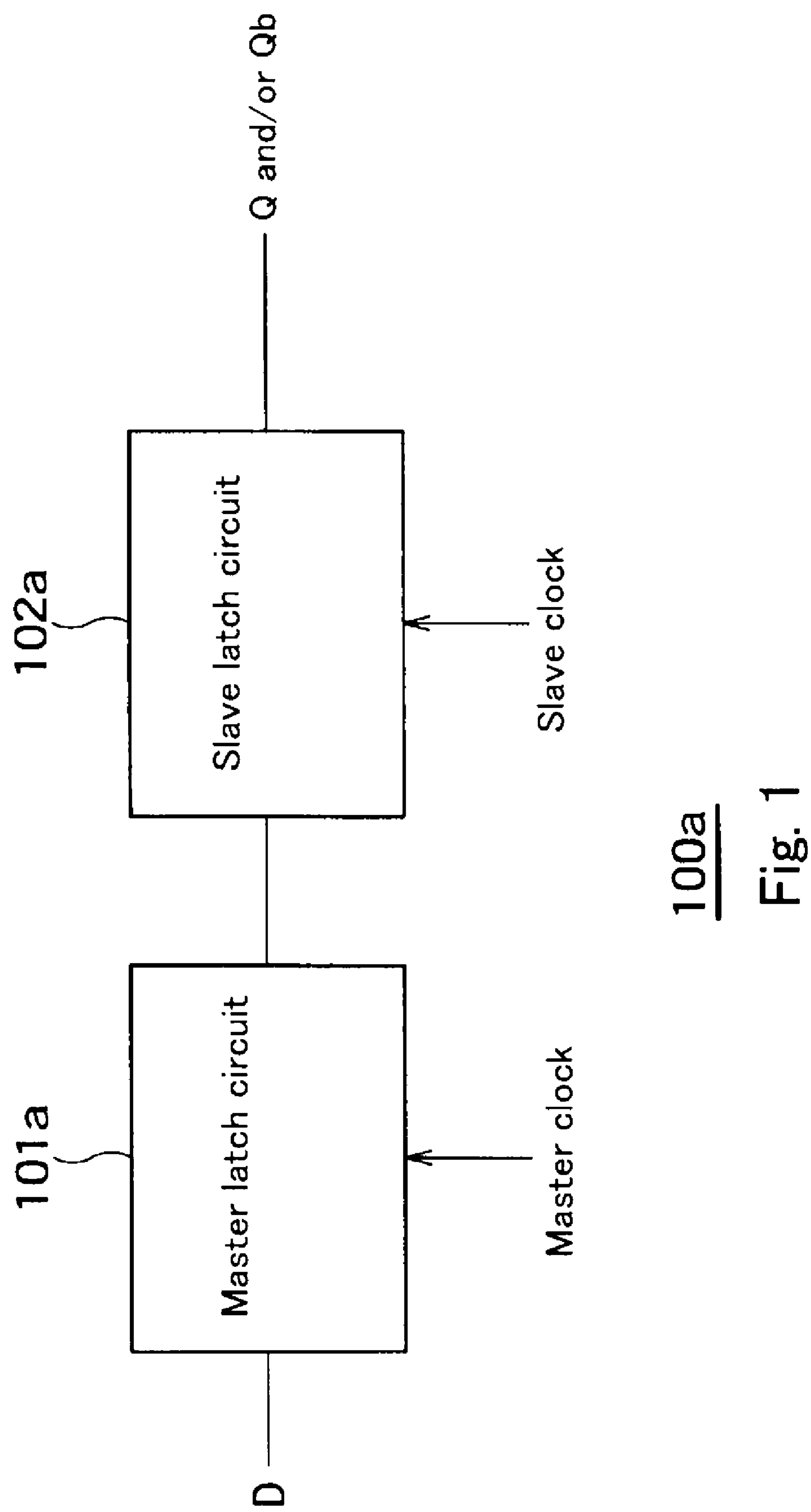
FIG. 1 is a block diagram of a master-slave flip-flop **100*a*** according to a comparative example.

Various other objects, features and attendant advantages of the present invention will be more fully appreciated from the following detailed description when considered in connection with the accompanying drawings in which like reference characters designate like or corresponding parts throughout the several views.

Comparative Example

First, as a comparative example, description will be given of a configuration and function of a general master-slave flip-flop.

As shown in FIG. 1, the flip-flop 100*a* includes a master latch circuit 101*a* to which input data D is inputted, and a slave latch circuit 102*a* to which an output of this master latch circuit 101*a* is inputted, and from which an output of the flip-flop 100*a* Q, Qb, or both are outputted.

A master clock is inputted into the master latch circuit 101*a*, and a slave clock is inputted into the slave latch circuit 102*a*.

Mechanisms for retaining data is provided inside the master latch circuit 101*a* and the slave latch circuit 102*a*, and can retain positive logic of the data and negative logic of the data.

Here, suppose that the positive logic of the data retained by the master latch circuit 101*a* is msp, and the negative logic of the data retained by the master latch circuit 101*a* is msn. Moreover, suppose that the positive logic of the data retained by the slave latch circuit 102*a* is ssp, and the negative logic of the data retained by the slave latch circuit 102*a* is ssn.

In the flip-flop 100*a* of the comparative example, in accordance with an inputted clock, only one of the master latch circuit 101*a* and the slave latch circuit 102*a* retains data, and the master latch circuit 101*a* and the slave latch circuit 102*a* do not retains the data at the same time.

Therefore, as already mentioned, when radiation enters a node that retains the data, the retained data may be inverted so that a soft error of the flip-flop occurs.

To solve this, in a semiconductor integrated circuit according to one aspect of the present invention, the master latch circuit and the slave latch circuit retain the same data at the same time, and in this state, a data retaining node of the master latch circuit and that of the slave latch circuit are electrically connected to each other through a switching circuit.

Thereby, the soft error resistance is improved.

Embodiment 1

Figure 2:
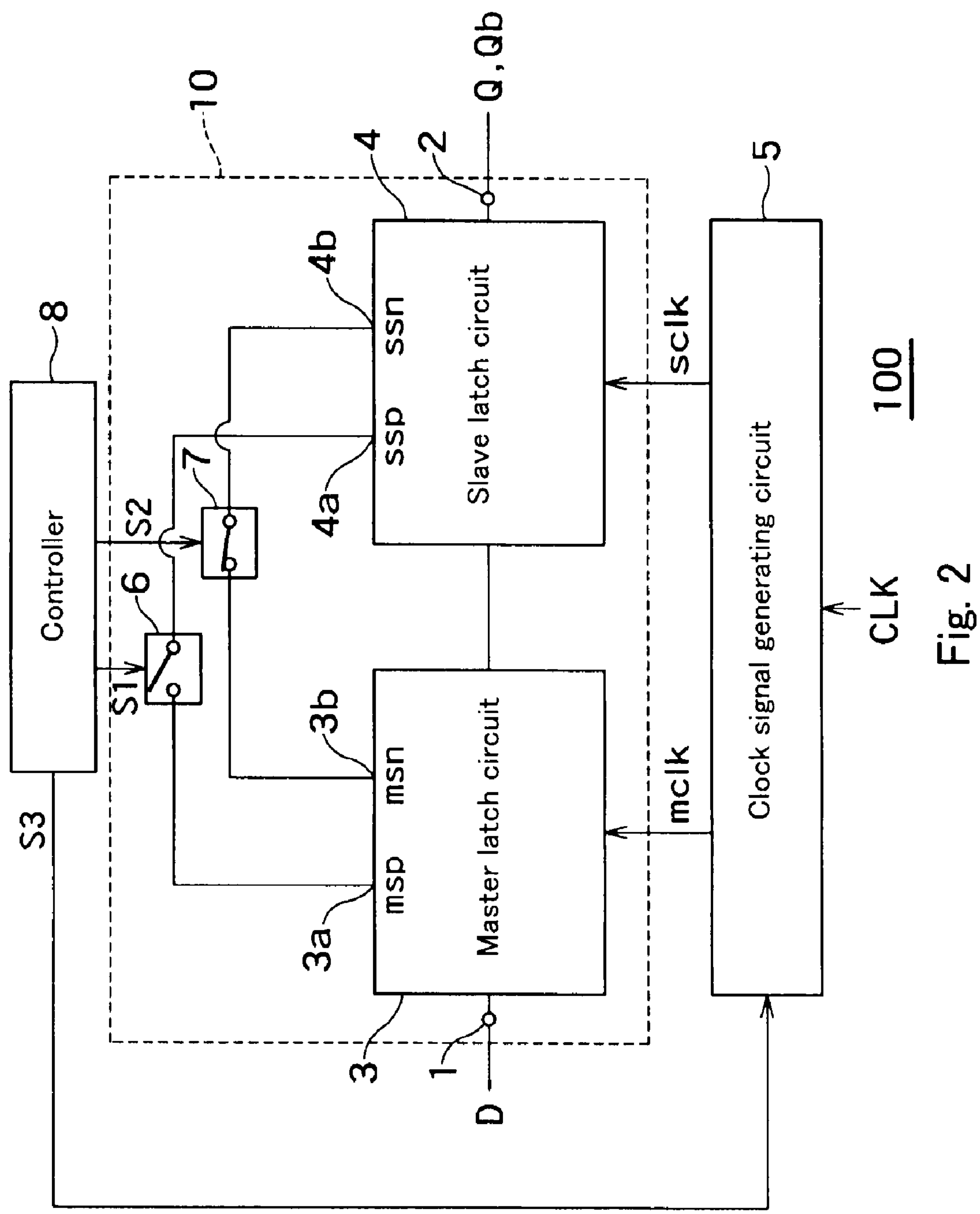
FIG. 2 is a block diagram of a semiconductor integrated circuit 100 according to Embodiment 1.

As shown in FIG. 2, the semiconductor integrated circuit 100 includes a data input terminal 1, a data output terminal 2, a master latch circuit 3, a slave latch circuit 4, a clock signal generating circuit 5, a first switching circuit 6, a second switching circuit 7, and a controller 8.

The data input terminal 1, the data output terminal 2, the master latch circuit 3, the slave latch circuit 4, the first switching circuit 6, and the second switching circuit 7 configure a flip-flop 10.

An input of the master latch circuit 3 is connected to the data input terminal 1. This master latch circuit 3 has a first data retaining terminal 3*a* for retaining the positive logic msp of data inputted through the data input terminal 1. The master latch circuit 3 has a second data retaining terminal 3*b* for retaining the negative logic (inverted logic of the logic retained in the first data retaining terminal 3*a*) msn of the data inputted through the data input terminal 1.

An input of the slave latch circuit 4 is connected to an output of the master latch circuit 3, and an output of the slave latch circuit 4 is connected to the data output terminal 2. This slave latch circuit 4 has a third data retaining terminal 4*a* for retaining the positive logic ssp of data inputted from the master latch circuit 3. Moreover, the slave latch circuit 4 has a fourth data retaining terminal 4*b* for retaining the negative logic (inverted logic of the logic retained in third data retaining terminal 4*a*) ssn of the data inputted from the master latch circuit 3.

On the basis of a reference clock CLK, the clock signal generating circuit 5 generates and outputs a first clock signal mclk that controls operation of the master latch circuit 3 and a second clock signal sclk that controls operation of the slave latch circuit 4.

In other words, in response to this first clock signal mclk, the master latch circuit 3 retains the data inputted from the data input terminal 1, or outputs the inputted data as it is (or after buffering the inputted data). Moreover, in response to the second clock signal sclk, the slave latch circuit 4 retains the data inputted from the master latch circuit 3, or outputs the inputted data as it is (or after buffering the inputted data).

The first switching circuit 6 is connected between the first data retaining terminal 3*a* and the third data retaining terminal 4*a*.

The second switching circuit 7 is connected between the second data retaining terminal 3*b* and the fourth data retaining terminal 4*b*.

Incidentally, for example, an MOS transistor, a transfer gate formed of a MOS transistor, and the like are used for the first and second switching circuits 6 and 7.

The controller 8 controls the first switching circuit 6, the second switching circuit 7, and the clock signal generating circuit 5 with control signals S1, S2, and S3, respectively.

Now, description will be given of an example of operation of the semiconductor integrated circuit 100 having the above-mentioned configuration for improving the soft error resistance.

First, using the control signal S3, the controller 8 makes the clock signal generating circuit 5 control the first clock signal mclk and the second clock signal sclk. This brings about a state A where the slave latch circuit 4 retains the data that is retained in the master latch circuit 3 and inputted from the master latch circuit 3, or a state B where the slave latch circuit

4 passes the data, which is retained in the master latch circuit 3 and inputted from the master latch circuit 3, to the data output terminal 2.

Thereby, the controller 8 makes the logic of the data retained in the first data retaining terminal 3*a* identical to the logic of the data retained in the third data retaining terminal 4*a*, and simultaneously makes the logic of the data retained in the second data retaining terminal 3*b* identical to the logic of the data retained in the fourth data retaining terminal 4*b*.

Then, in either of the states A and B, the controller 8 turns on the first switching circuit 6 and the second switching circuit 7 using the respective control signals S1 and S2.

The above-mentioned operation of the semiconductor integrated circuit 100 improves the soft error resistance.

Additionally, though in this embodiment after controlling signal S3, first switching circuit 6 and second switching circuit 7 are turned on by control signal S1 and S2, it is possible to turn on these switching circuits simultaneously when controlling signal S3, or turn on these switching circuits before controlling signal S3.

In other words, even when, for example, radiation enters the first data retaining terminal 3*a* and charges are induced by the radiation, the slave latch circuit 4 operates so as to rewrite the data of the master latch circuit 3. For this reason, inversion of the data of the master latch circuit 3 due to the radiation can be suppressed.

Consequently, the semiconductor integrated circuit 100 can improve the soft error resistance of the flip-flop 10.

Figure 3:
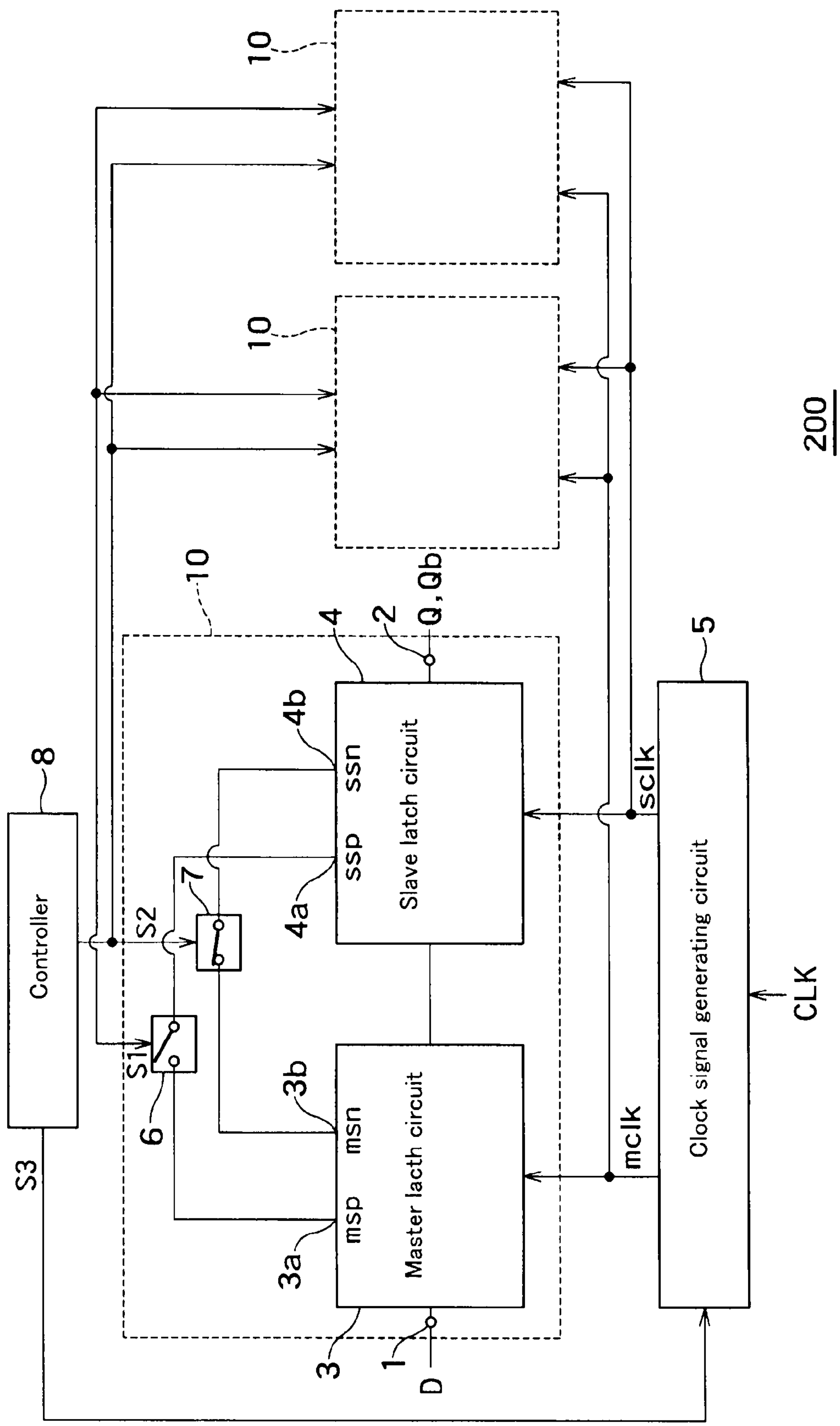
FIG. 3 is a block diagram of principal parts of a semiconductor integrated circuit 200 according to Embodiment 1.

The clock signal generating circuit 5 and the controller 8 may be shared by multiple flip-flops 10. FIG. 3 is a diagram showing a configuration of principal portions of a semiconductor integrated circuit 200 according to embodiment 1, which is one aspect of the present invention. In FIG. 3, components given the same reference numerals as those in FIG. 2 are the same components as those of the semiconductor integrated circuit 100.

As shown in FIG. 3, the clock signal generating circuit 5 and the controller 8 are shared by multiple flip-flops 10. Thereby, the semiconductor integrated circuit 200 can suppress increase in area, while improving the soft error resistance of the flip-flops 10.

Moreover, in the semiconductor integrated circuit 200, at least one of the first switching circuit 6 and the second switching circuit 7 needs to be provided.

Figure 4:
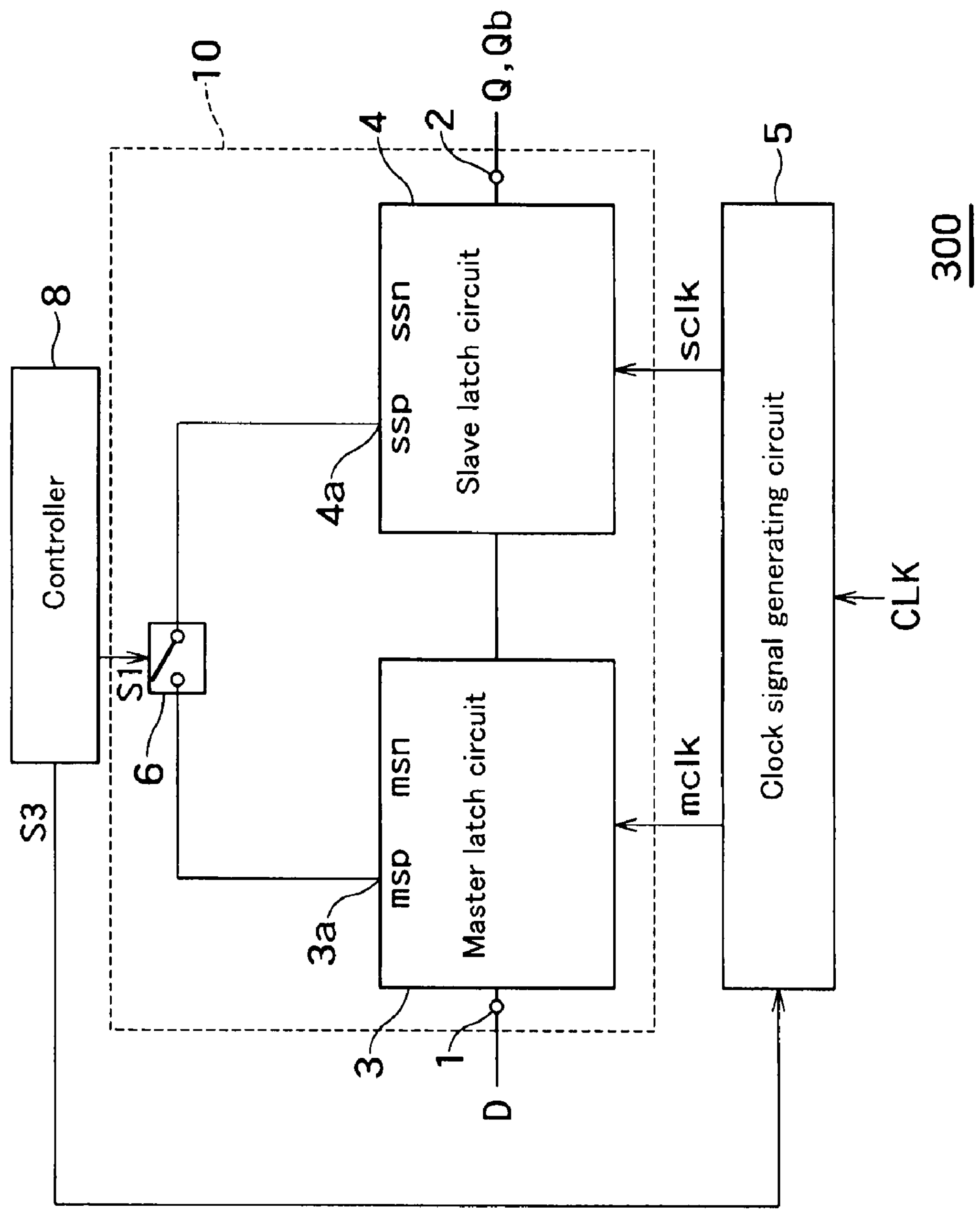
FIG. 4 is a block diagram of principal parts of a semiconductor integrated circuit 300 according to Embodiment 1.
Figure 5:
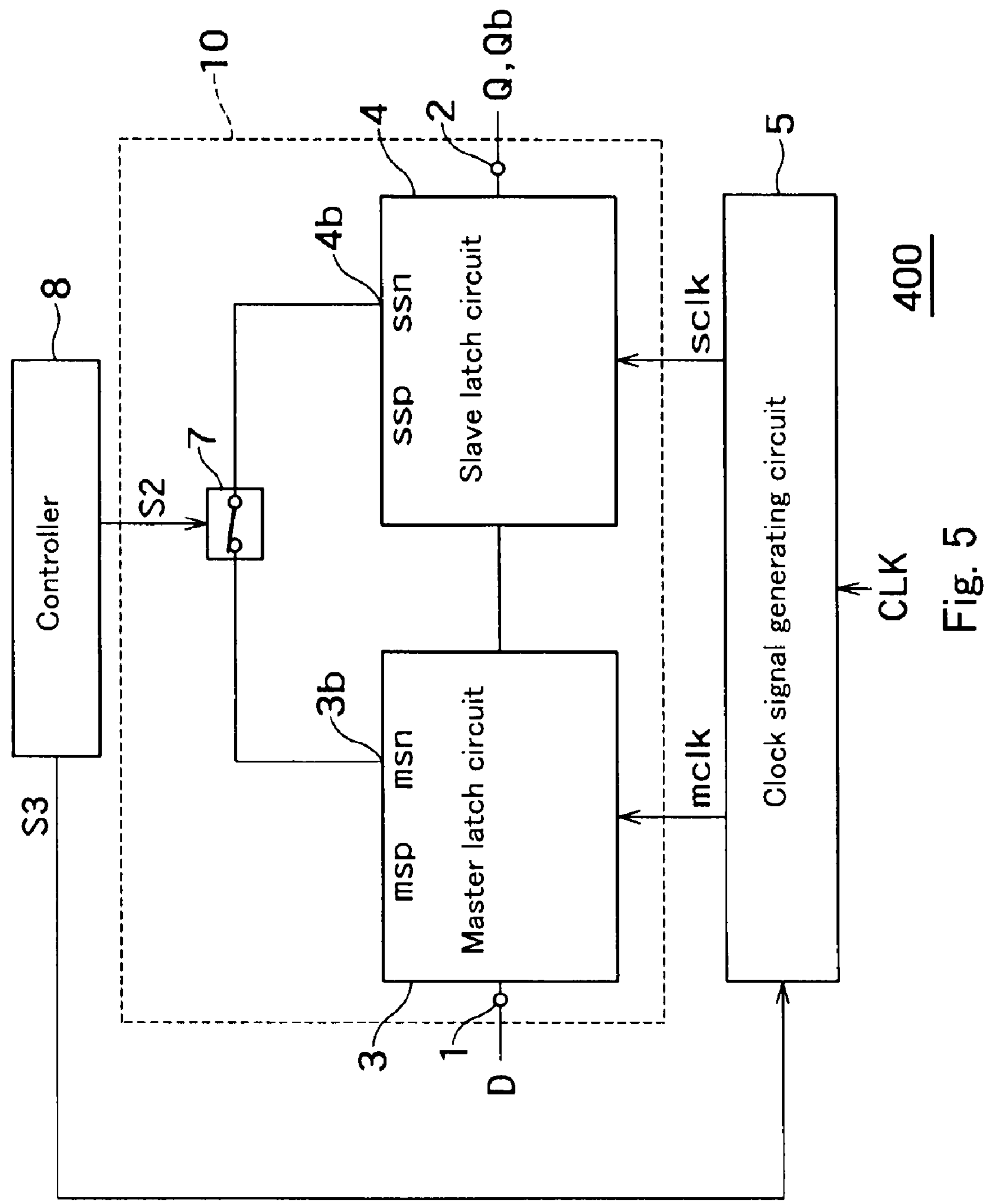
FIG. 5 is a block diagram of principal parts of a semiconductor integrated circuit 400 according to Embodiment 1.

Here, FIG. 4 is a diagram showing a configuration of principal portions of a semiconductor integrated circuit 300 according to embodiment 1, which is one aspect of the present invention. In addition, FIG. 5 is a diagram showing a configuration of principal portions of a semiconductor integrated circuit 400 according to embodiment 1, which is one aspect of the present invention. In FIGS. 4 and 5, components given the same reference numerals as those in FIG. 2 are the same components as those of the semiconductor integrated circuit 100.

The semiconductor integrated circuits 300 and 400, respectively shown in FIG. 4 and FIG. 5, are the same circuit as the semiconductor circuit 100 expect that a switching circuit is removed. Accordingly, although performance to keep the logic of the data retaining terminal of the master latch circuit 3 identical to that of the slave latch circuit 4 declines, the same effect as that of the semiconductor integrated circuit 100 can be obtained.

As mentioned above, with the semiconductor integrated circuit according to the present embodiment, the soft error resistance of a flip-flop can be improved.

Embodiment 2

In Embodiment 2, description will be given of an example of specific circuit configurations of the master latch circuit 3, the slave latch circuit 4, and the clock signal generating circuit 5 in the semiconductor integrated circuit 100 shown in FIG. 2.

Figure 6A:
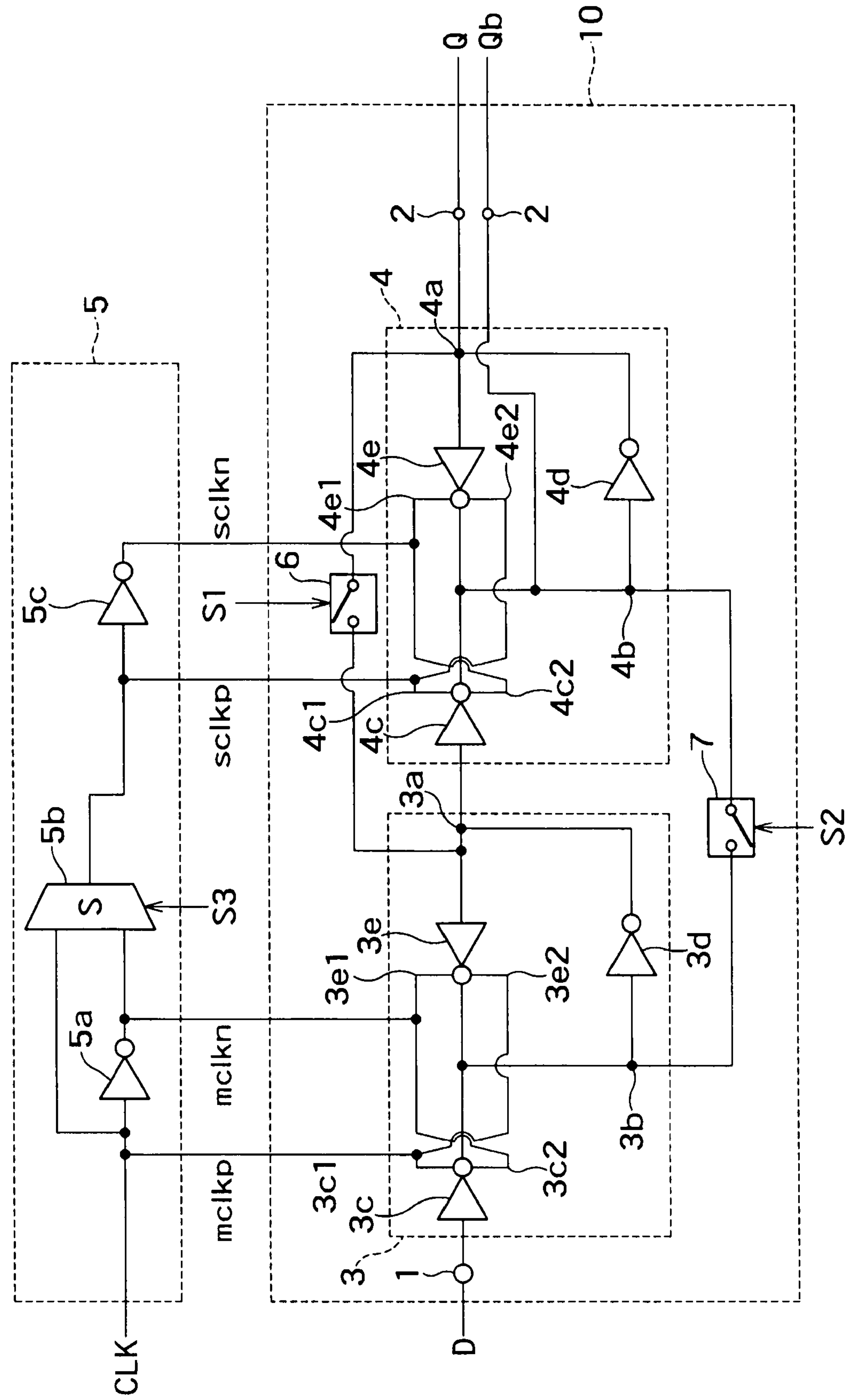
FIG. 6A is a circuit diagram of a master latch circuit, a slave latch circuit, and a clock signal generating circuit, which are shown in FIG. 2.

As shown in FIG. 6A, the master latch circuit 3 includes the first data retaining terminal 3*a*, the second data retaining terminal 3*b*, a first clocked inverter 3*c*, a first inverter 3*d*, and a second clocked inverter 3*e*.

Here, description of the first clock signal mclk of FIG. 2 will be given in two parts: one for a clock signal mclkp of a positive phase (below, described as a first (positive phase) clock signal); and one for a clock signal mclkn of an opposite phase.

An input of the first clocked inverter 3*c* is connected to the data input terminal 1, and an output of the first clocked inverter 3*c* is connected to the second data retaining terminal 3*b*. This first clocked inverter 3*c* has a first clock terminal 3*c*1 into which the first clock signal mclkp is inputted, and has a second clock terminal 3*c*2 into which the clock signal mclkn of a phase opposite to the first clock signal mclkp is inputted.

An input of the first inverter 3*d* is connected to the second data retaining terminal 3*b*, and an output of the first inverter 3*d* is connected to the first data retaining terminal 3*a*.

An input of the second clocked inverter 3*e* is connected to the first data retaining terminal 3*a*, and an output of the second clocked inverter 3*e* is connected to the second data retaining terminal 3*b*. This second clocked inverter 3*e* has a third clock terminal 3*e*1 into which the clock signal mclkn of the phase opposite to the first clock signal mclkp is inputted, and has a fourth clock terminal 3*e*2 into which the first clock signal mclkp is inputted.

The slave latch circuit 4 includes the third data retaining terminal 4*a*, the fourth data retaining terminal 4*b*, a third clocked inverter 4*c*, a second inverter 4*d*, and a fourth clocked inverter 4*e*.

Here, description of the second clock signal sclk of FIG. 2 will be given in two parts: one for a clock signal sclkp of a positive phase (below, described as the second (positive phase) clock signal); and one for a clock signal sclkn of the opposite phase.

An input of the third clocked inverter 4*c* is connected to the first data retaining terminal 3*a* of the master latch circuit 3, and an output of the third clocked inverter 4*c* is connected to the fourth data retaining terminal 4*b*. This third clocked inverter 4*c* has a fifth clock terminal 4*c*1 into which the second clock signal sclkp is inputted, and has a sixth clock terminal 4*c*2 into which the clock signal sclkn of a phase opposite to the second clock signal sclkp is inputted.

An input of the second inverter 4*d* is connected to the fourth data retaining terminal 4*b*, and an output of the second inverter 4*d* is connected to the third data retaining terminal 4*a*.

An input of the fourth clocked inverter 4*e* is connected to the third data retaining terminal 4*a*, and an output of the fourth clocked inverter 4*e* is connected to the fourth data retaining terminal 4*b*. This fourth clocked inverter 4*e* has a seventh clock terminal 4*e*1 into which the clock signal sclkn of the phase opposite to the second clock signal sclkp is inputted, and has an eighth clock terminal 4*e*2 into which the second clock signal sclkp is inputted.

The data output terminal 2 is connected to the third data retaining terminal 4*a* when outputting an output Q, and is connected to the fourth data retaining terminal 4*b* when outputting an output Qb.

Meanwhile, the clock signal generating circuit 5 includes an inverter 5*a*, a selector 5*b*, and an inverter 5*c*.

An input of the inverter 5*a* is connected to the first and fourth clock terminals 3*c*1 and 3*e*2, and an output of the inverter 5*a* is connected to the second and third clock terminals 3*c*2 and 3*e*1. This inverter 5*a* receives the reference clock signal CLK (here, used as the clock signal mclkp of the positive phase), and outputs an inverted signal of this reference clock signal CLK (the clock signal mclkn of the opposite phase).

The reference clock signal CLK (that is, the clock signal mclkp of the positive phase) and the clock signal mclkn of the opposite phase are inputted into the selector 5*b*. In response to the control signal S3, this selector 5*b* outputs either of the clock signal mclkp of the positive phase or the clock signal mclkn of the opposite phase to the fifth and eighth clock terminals 4*c*1 and 4*e*2 as the second clock signal sclkp.

In response to the control signal S3, the selector 5*b* outputs the clock signal mclkn of the opposite phase at the time of normal operation. On the other hand, in response to the control signal S3, when the soft error resistance is to be improved, the selector 5*b* outputs the clock signal mclkp of the positive phase.

An input of the inverter 5*c* is connected to the fifth and eighth clock terminals 4*c*1 and 4*e*2, and an output of the inverter 5*c* is connected to the sixth and seventh clock terminals 4*c*2 and 4*e*1. This inverter 5*c* receives the clock signal sclkp of the positive phase, and outputs an inverted clock signal sclkn of the opposite phase.

As mentioned above, the clock signal generating circuit 5 is configured to change the clock signal between the clock signals mclkp, mclkn, sclkp, and sclkn according to the reference clock signal CLK.

In response to the clock signal mclkp or mclkn, the master latch circuit 3 retains the data inputted from the data input terminal 1, or outputs the inputted data as it is (or after buffering the inputted data).

Moreover, in response to the clock signal sclkp or sclkn, the slave latch circuit 4 retains the data inputted from the master latch circuit 3, or outputs the inputted data as it is (or after buffering the inputted data).

Now, description will be given of an example of operation of the semiconductor integrated circuit 100 having the above-mentioned configuration for improving the soft error resistance.

Figure 6B:
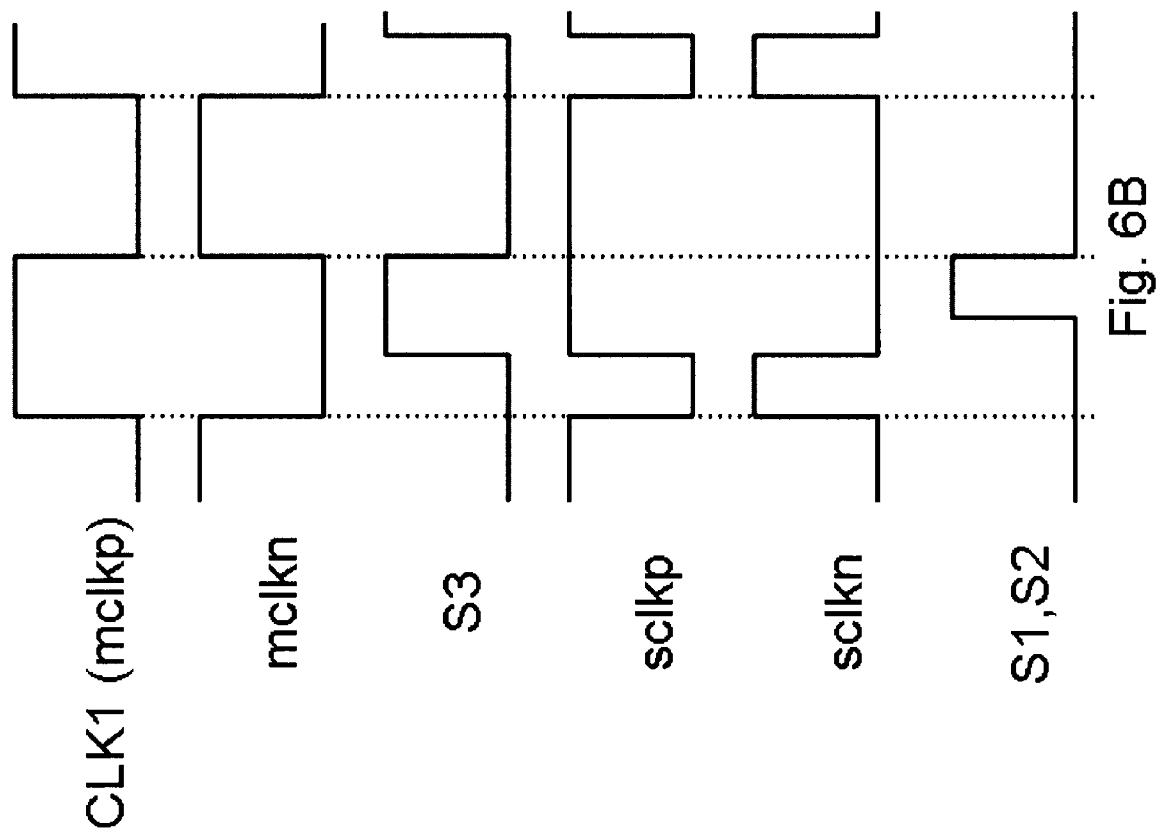
FIG. 6B is an example of a timing chart of semiconductor integrated circuit showing in FIG. 6A.

First, as shown in FIG. 6B, until rising edge of CLK1 during CLK1=0, master latch circuit 3 inputs the data from data input terminal 1. At the rising edge of CLK1, master latch circuit 3 starts to retain the data. Then, slave latch circuit 4 inputs the data from master latch circuit. This brings about the state B where the slave latch circuit 4 passes the data, which is retained in the master latch circuit 3 and is inputted from the master latch circuit 3, to the data output terminal 2. Next, using the control signal S3 (S3="High" level), the controller 8 makes the clock signal generating circuit 5 control the second clock signal sclk (sclkp, sclkn). For example, using the control signal S3, the controller 8 makes the clock signal generating circuit 5 switch the clock signal sclkp to a "High" level (that is, logic "1") (the clock signals sclkn is switched to a "Low" level (that is, logic "0")).

This brings about the state A where the slave latch circuit 4 retains the data retained in the master latch circuit 3 and inputted from the master latch circuit 3.

Thereby, the controller 8 makes the logic of the data retained in the first data retaining terminal 3*a* identical to the logic of the data retained in the third data retaining terminal 4*a*, and simultaneously, makes the logic of the data retained in the second data retaining terminal 3*b* identical to the logic of the data retained in the fourth data retaining terminal 4*b*.

Then, in the states A, the controller 8 turns on the first switching circuit 6 and the second switching circuit 7 using the respective control signals S1 and S2 (S1,S2="H").

Even when, for example, radiation enters the first data retaining terminal 3*a* and charges are induced in S1,S2="H" by the radiation, the slave latch circuit 4 operates so as to rewrite the data of the master latch circuit 3 with the master latch data saved in the slave circuit 4. For this reason, inversion of the data of the master latch circuit 3 due to the radiation can be suppressed.

Consequently, the semiconductor integrated circuit 100 can improve the soft error resistance of the flip-flop 10.

After that, when clock signal CLK1, control signals S1, S2, and S3 are set to "L", master latch circuit 3 inputs the next data from data terminal 1, and slave latch circuit 4 outputs the data.

Additionally, though in this embodiment after control signal S3 is set to "H", first switching circuit 6 and second switching circuit 7 are turned on by control signal S1 and S2, it is possible to turn on these switching circuits simultaneously when control signal S3 is set to "H", or turn on these switching circuits before setting control signal S3 to "H".

As mentioned above, with the semiconductor integrated circuit according to the present embodiment, the soft error resistance of a flip-flop can be improved.

Embodiment 3

In the present Example 3, description will be given particularly of an example of generalized operation of the clock signal generating circuit 5.

Figure 7:
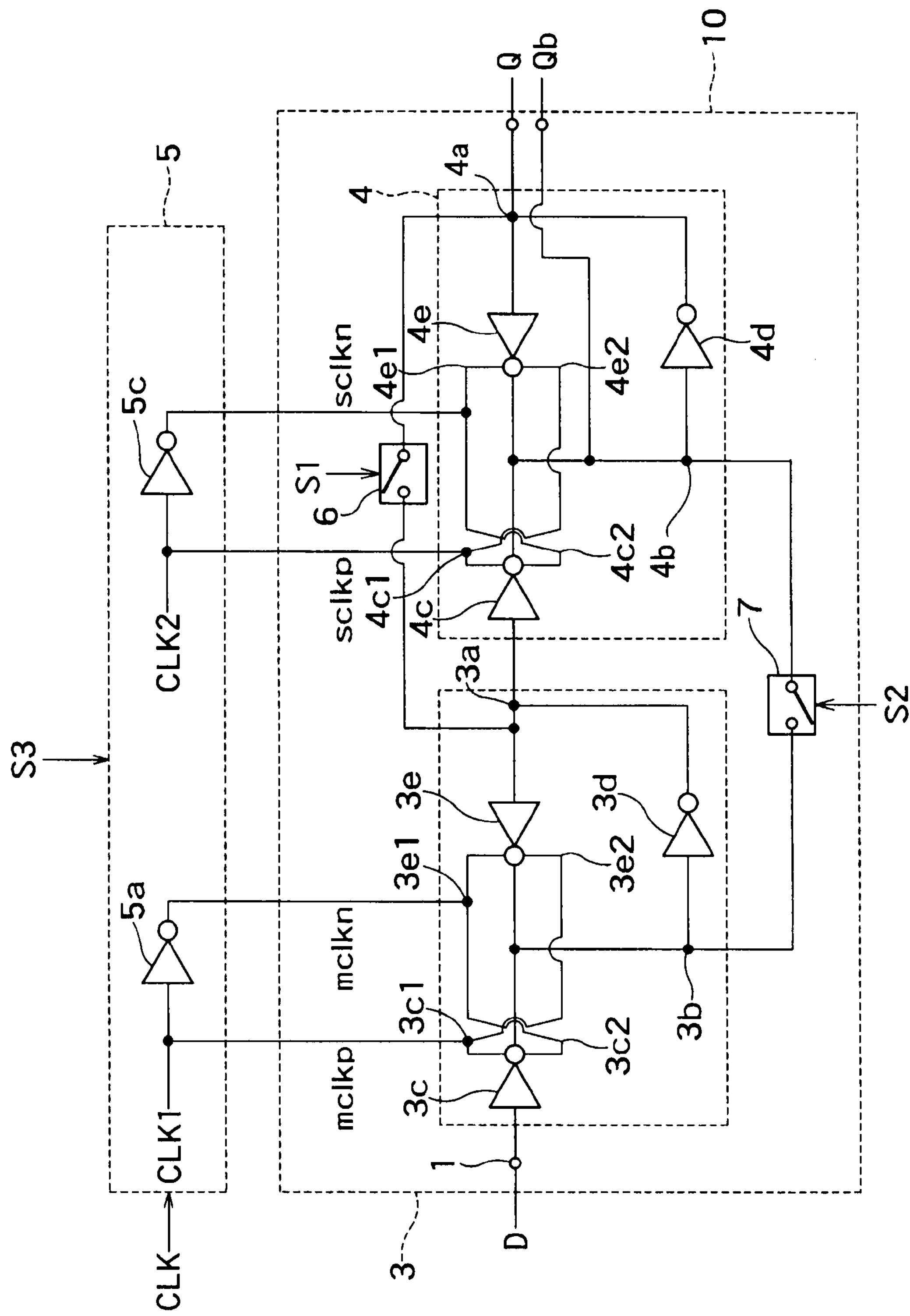
FIG. 7A is a circuit diagram of the master latch circuit, the slave latch circuit, and the clock signal generating circuit, which are shown in FIG. 2.
FIG. 7B is an example of a timing chart of semiconductor integrated circuit showing in FIG. 7A.

FIG. 7A is a diagram showing an example of specific circuit configurations of the master latch circuit 3, the slave latch circuit 4, and the clock signal generating circuit 5 which are shown in FIG. 2. In FIG. 7A, the master latch circuit 3 and the slave latch circuit 4 each have the same configuration as that in FIG. 6A.

As shown in FIG. 7A, the clock signal generating circuit 5 includes the inverter 5*a* and the inverter 5*c*.

An input of the inverter 5*a* is connected to the first and fourth clock terminals 3*c*1 and 3*e*2, and an output of the inverter 5*a* is connected to the second and third clock terminals 3*c*2 and 3*e*1. This inverter 5*a* receives a first reference clock signal CLK1 on the basis of the reference clock signal CLK (here, used as the clock signal mclkp of the positive phase), and outputs an inverted clock signal mclkn of the opposite phase.

An input of the inverter 5*c* is connected to the fifth and eighth clock terminals 4*c*1 and 4*e*2, and an output of the inverter 5*c* is connected to the sixth and seventh clock terminals 4*c*2 and 4*e*1. This inverter 5*c* receives a second reference clock signal CLK2 on the basis of the reference clock signal CLK (here, used as the clock signal sclkp of the positive phase), and outputs an inverted clock signal sclkn of the opposite phase.

Now, description will be given of an example of operation of the semiconductor integrated circuit 100 having the above-mentioned configuration for improving the soft error resistance.

Figure 7B:
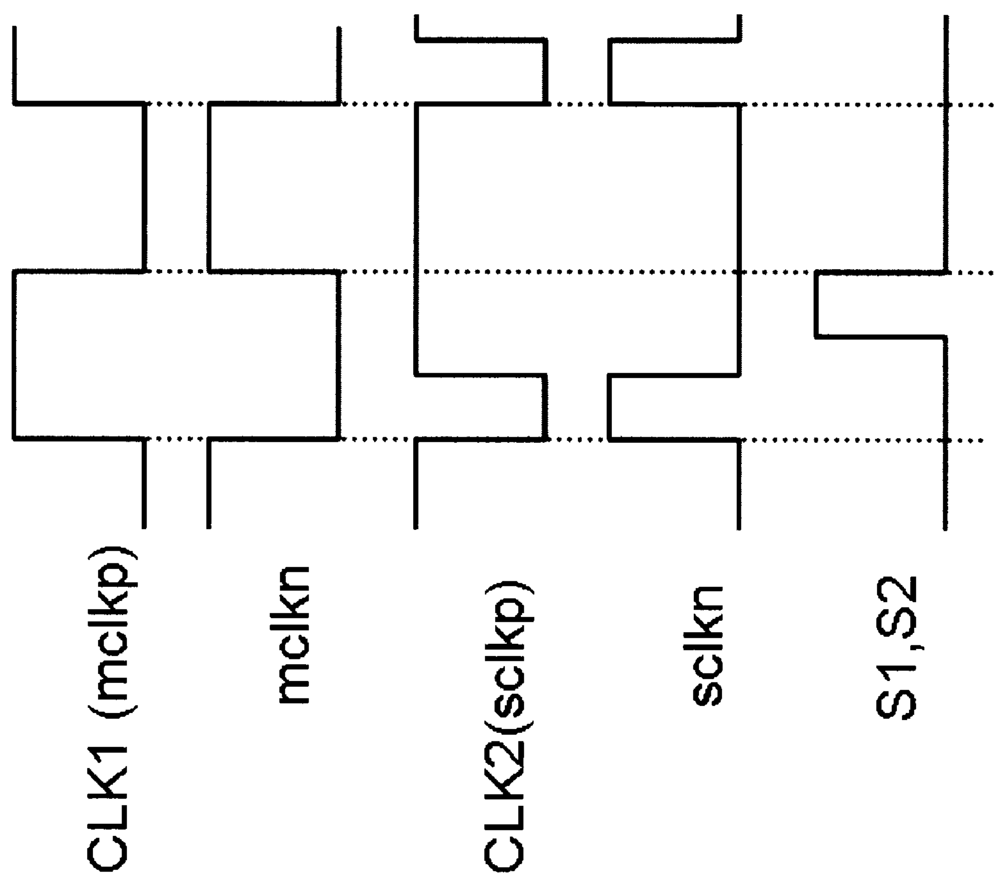

First, as shown in FIG. 7B, until rising edge of CLK1 during CLK1=0, master latch circuit 3 inputs the data from data input terminal 1. At the rising edge of CLK1, master latch circuit 3 starts to retain the data. Then, slave latch circuit 4 inputs the data from master latch circuit. This brings about the state B where the slave latch circuit 4 passes the data, which is retained in the master latch circuit 3 and is inputted from the master latch circuit 3, to the data output terminal 2.

Next, using the control signal S3 (CLK2="H"), the controller 8 makes the clock signal generating circuit 5 control the second reference clock signal CLK2 (sclkp, sclkn) so that this brings about the state A where the slave latch circuit 4 retains the data retained in the master latch circuit 3 and inputted from the master latch circuit 3. For example, as shown in FIG. 7B, when clock signal CLK2 is set to "H", the slave latch circuit 4 retains the data retained in the master latch circuit 3 and inputted from the master latch circuit 3 because clocked inverter 4*c* is turned off and inverter 4*e* is turned on.

Thereby, the controller 8 makes the logic of the data retained in the first data retaining terminal 3*a* identical to the logic of the data retained in the third data retaining terminal 4*a*, and simultaneously, makes the logic of the data retained in the second data retaining terminal 3*b* identical to the logic of the data retained in the fourth data retaining terminal 4*b*. Then, in the states A, the controller 8 turns on the first switching circuit 6 and the second switching circuit 7 using the respective control signals S1 and S2 (S1,S2="H").

Even when, for example, radiation enters the first data retaining terminal 3*a* and charges are induced by the radiation, the slave latch circuit 4 operates so as to rewrite the data of the master latch circuit 3 with the master latch data saved in the slave circuit 4. For this reason, inversion of the data of the master latch circuit 3 due to the radiation can be suppressed.

Consequently, the semiconductor integrated circuit 100 can improve the soft error resistance of the flip-flop 10.

After that, when clock signals CLK1, control signals S1 and S2 are set to "L", master latch circuit 3 inputs the next data from data terminal 1, and slave latch circuit 4 outputs the data.

Additionally, though in this embodiment after control signal CLK2 is set to "H", first switching circuit 6 and second switching circuit 7 are turned on by control signal S1 and S2, it is possible to turn on these switching circuits simultaneously when control signal S3 is set to "H", or turn on these switching circuits before setting control signal CLK2 to "H".

As mentioned above, with the semiconductor integrated circuit according to the present embodiment, the soft error resistance of a flip-flop can be improved.

Embodiment 4

In Embodiment 4, description will be given of another example of specific circuit configurations of the master latch circuit 3, the slave latch circuit 4, and the clock signal generating circuit 5 in the semiconductor integrated circuit 100 shown in FIG. 2.

Figure 8:
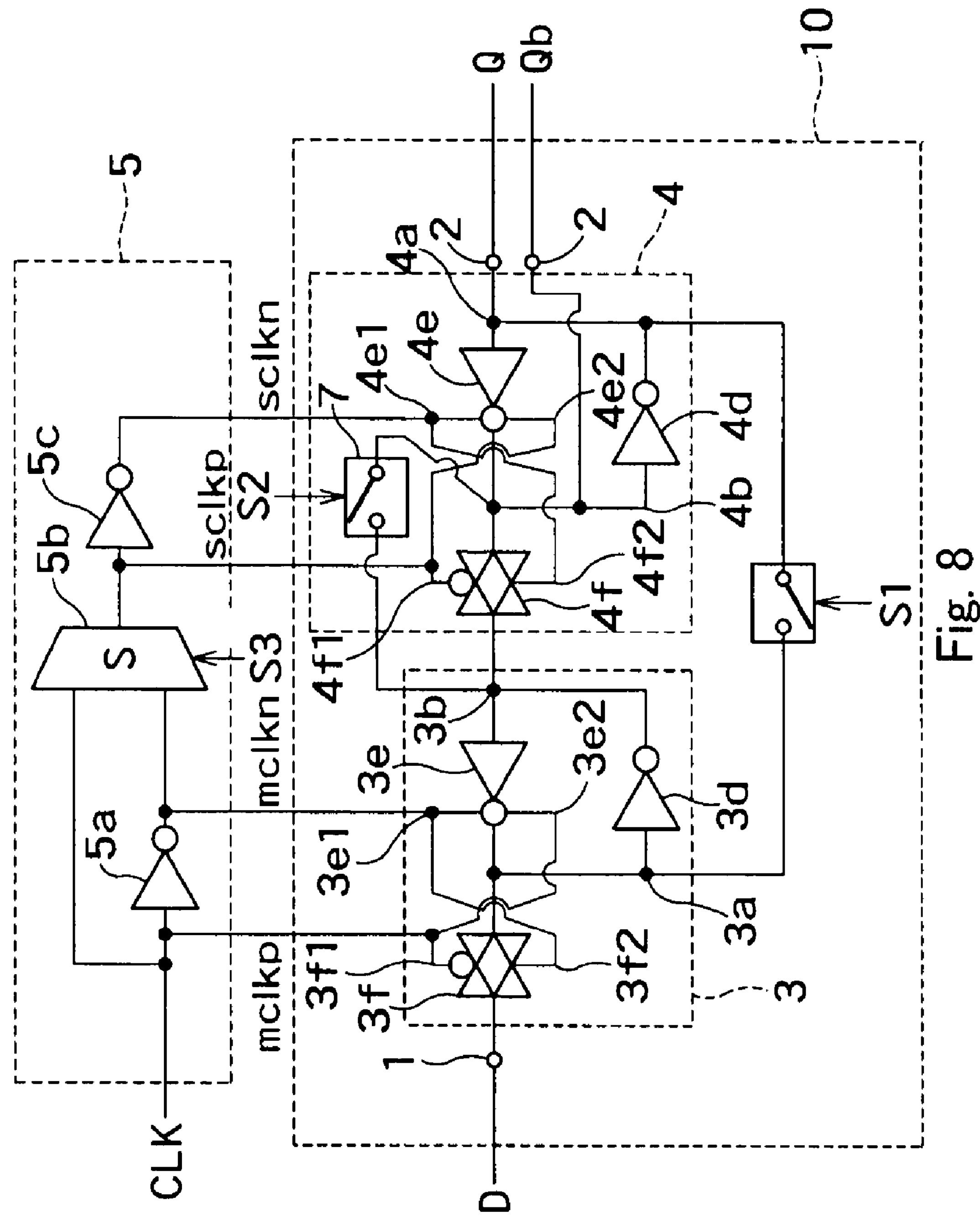
FIG. 8 is a circuit diagram of the master latch circuit, the slave latch circuit, and the clock signal generating circuit, which are shown in FIG. 2.

FIG. 8 is a diagram showing an example of specific circuit configurations of the master latch circuit 3, the slave latch circuit 4, and the clock signal generating circuit 5, which are shown in FIG. 2. In FIG. 8, the clock signal generating circuit 5 has the same configuration as that in FIG. 6A.

As shown in FIG. 8, the master latch circuit 3 includes the data retaining terminal 3*a*, the data retaining terminal 3*b*, a first transmission gate 3*f*, an inverter 3*d*, and a clocked inverter 3*e*. In comparison with the master latch circuit 3 of FIG. 6A, the transmission gate 3*f* is provided in the master latch circuit 3 of FIG. 8 in place of a clocked inverter 3*c*. In addition, in comparison with the master latch circuit 3 of FIG. 6A, the position of the data retaining terminal 3*a* is replaced with the position of the data retaining terminal 3*b* in the master latch circuit 3 of FIG. 8.

An input of the first transmission gate 3*f* is connected to the data input terminal 1, and an output of the first transmission gate 3*f* is connected to the data retaining terminal 3*a*. This first transmission gate 3*f* has a first inverted clock terminal 3*f*1 into which the first clock signal mclkp is inputted, and has a first non-inverted clock terminal 3*f*2 into which the clock signal mclkn of the phase opposite to the first clock signal mclkp is inputted.

An input of the first inverter 3*d* is connected to the data retaining terminal 3*a*, and an output of the first inverter 3*d* is connected to the data retaining terminal 3*b*.

An input of the clocked inverter 3*e* is connected to the data retaining terminal 3*b*, and an output of the clocked inverter 3*e* is connected to the data retaining terminal 3*a*. This clocked inverter 3*e* has a clock terminal 3*e*1 into which the clock signal mclkn of the phase opposite to the first clock signal mclkp is inputted, and has a clock terminal 3*e*2 into which the first clock signal mclkp is inputted.

The slave latch circuit 4 includes the data retaining terminal 4*a*, the data retaining terminal 4*b*, a second transmission gate 4*f*, an inverter 4*d*, and a clocked inverter 4*e*. In comparison with the slave latch circuit 4 of FIG. 6A, the transmission gate 4*f* is provided in the slave latch circuit 4 of FIG. 8 in place of a clocked inverter 4*c*.

An input of the second transmission gate 4*f* is connected to the data retaining terminal 3*a*, and an output of the second transmission gate 4*f* is connected to the data retaining terminal 4*b*. This second transmission gate 4*f* has a second inverted clock terminal 4*f*1 into which the second clock signal sclkp is inputted, and has a second non-inverted clock terminal 4*f*2 into which the clock signal sclkn of the phase opposite to the second clock signal sclkp is inputted.

An input of the inverter 4*d* is connected to the data retaining terminal 4*b*, and an output of the inverter 4*d* is connected to the data retaining terminal 4*a*.

An input of the clocked inverter 4*e* is connected to the data retaining terminal 4*a*, and an output of the clocked inverter 4*e* is connected to the data retaining terminal 4*b*. This clocked inverter 4*e* has a clock terminal 4*e*1 into which the clock signal sclkn of the phase opposite to the second clock signal sclkp is inputted, and has a clock terminal 4*e*2 into which the second clock signal sclkp is inputted.

Now, description will be given of an example of operation of the semiconductor integrated circuit 100 having the above-mentioned configuration for improving the soft error resistance.

First, similarly to the case of Embodiment 2, until rising edge of CLK1 during CLK1=0, master latch circuit 3 inputs the data from data input terminal 1. At the rising edge of CLK1, master latch circuit 3 starts to retain the data. Then, slave latch circuit 4 inputs the data from master latch circuit. This brings about the state B where the slave latch circuit 4 passes the data, which is retained in the master latch circuit 3 and is inputted from the master latch circuit 3, to the data output terminal 2.

Next, using the control signal S3 (S3="High" level), the controller 8 makes the clock signal generating circuit 5 control the second clock signal sclk (sclkp, sclkn). For example, using the control signal S3, the controller 8 makes the clock signal generating circuit 5 switch the clock signal sclkp to a "High" level (that is, logic "1") (the clock signals sclkn is switched to a "Low" level (that is, logic "0")).

This brings about the state A where the slave latch circuit 4 retains the data retained in the master latch circuit 3 and inputted from the master latch circuit 3.

Thereby, the controller 8 makes the logic of the data retained in the first data retaining terminal 3*a* identical to the logic of the data retained in the third data retaining terminal 4*a*, and simultaneously, makes the logic of the data retained in the second data retaining terminal 3*b* identical to the logic of the data retained in the fourth data retaining terminal 4*b*.

Then, in the states A, the controller 8 turns on the first switching circuit 6 and the second switching circuit 7 using the respective control signals S1 and S2 (S1,S2="H").

Even when, for example, radiation enters the first data retaining terminal 3*a* and charges are induced in S1,S2="H" by the radiation, the slave latch circuit 4 operates so as to rewrite the data of the master latch circuit 3 with the master latch data saved in the slave circuit 4. For this reason, inversion of the data of the master latch circuit 3 due to the radiation can be suppressed.

Consequently, the semiconductor integrated circuit 100 can improve the soft error resistance of the flip-flop 10.

After that, when clock signal CLK1, control signals S1, S2, and S3 are set to "L", master latch circuit 3 inputs the next data from data terminal 1, and slave latch circuit 4 outputs the data.

Additionally, though in this embodiment after control signal S3 is set to "H", first switching circuit 6 and second switching circuit 7 are turned on by control signal S1 and S2, it is possible to turn on these switching circuits simultaneously when control signal S3 is set to "H", or turn on these switching circuits before setting control signal S3 to "H".

As mentioned above, with the semiconductor integrated circuit according to the present embodiment, the soft error resistance of a flip-flop can be improved.

As in the case of the semiconductor integrated circuits 300 and 400 respectively shown in FIG. 4 and FIG. 5, even when either of the first and second switching circuits 6 and 7 is omitted, the same action and effect can be obtained.

Embodiment 5

In Embodiment 5, description will be given of an example of specific circuit configurations of the master latch circuit 3, the slave latch circuit 4, and the clock signal generating circuit 5 in the semiconductor integrated circuit 200 shown in FIG. 4. In other words, the configuration in which the second switching circuit 7 is omitted will be described.

Figure 9:
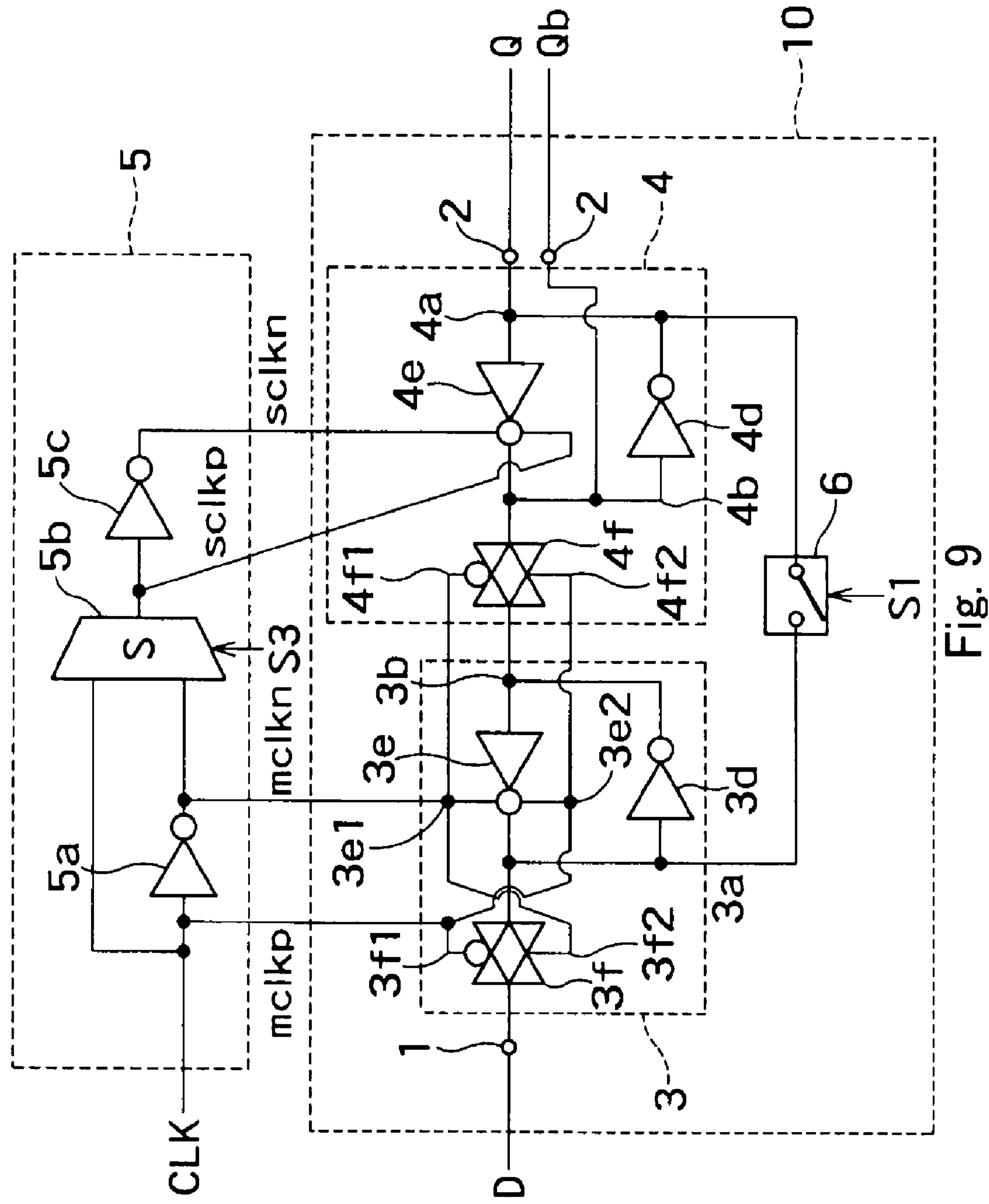
FIG. 9 is a circuit diagram of a master latch circuit, a slave latch circuit, and a clock signal generating circuit, which are shown in FIG. 4.

FIG. 9 is a diagram showing an example of specific circuit configurations of the master latch circuit 3, the slave latch circuit 4, and the clock signal generating circuit 5, which are shown in FIG. 4. In FIG. 9, the clock signal generating circuit 5 and the master latch circuit 3 each have the same configuration as that in FIG. 8.

As shown in FIG. 9, the slave latch circuit 4 includes a data retaining terminal 4*a*, a data retaining terminal 4*b*, a second transmission gate 4*f*, an inverter 4*d*, and a clocked inverter 4*e*. A connection relation between the inverter 4*d* and the clocked inverter 4*e* is the same as that of FIG. 8.

Here, an input of the second transmission gate 4*f* is connected to the data retaining terminal 3*b*, and an output of the second transmission gate 4*f* is connected to the data retaining terminal 4*b*. This second transmission gate 4*f* has a second inverted clock terminal 4*f*1 into which the clock signal mclkn of the phase opposite to the first clock signal mclkp is inputted, and has a second non-inverted clock terminal 4*f*2 into which the second clock signal mclkp is inputted.

Now, description will be given of an example of operation of the semiconductor integrated circuit 200 having the above-mentioned configuration for improving the soft error resistance.

First, similarly to the case of Embodiment 2, until rising edge of CLK1 during CLK1=0, master latch circuit 3 inputs the data from data input terminal 1. At the rising edge of CLK1, master latch circuit 3 starts to retain the data. Then, slave latch circuit 4 inputs the data from master latch circuit. This brings about the state B where the slave latch circuit 4 passes the data, which is retained in the master latch circuit 3 and is inputted from the master latch circuit 3, to the data output terminal 2.

Next, using the control signal S3 (S3="High" level), the controller 8 makes the clock signal generating circuit 5 control the second clock signal sclk (sclkp, sclkn). For example, using the control signal S3, the controller 8 makes the clock signal generating circuit 5 switch the clock signal sclkp to a "High" level (that is, logic "1") (the clock signals sclkn is switched to a "Low" level (that is, logic "0")).

This brings about the state A where the slave latch circuit 4 retains the data retained in the master latch circuit 3 and inputted from the master latch circuit 3.

Thereby, the controller 8 makes the logic of the data retained in the first data retaining terminal 3*a* identical to the logic of the data retained in the third data retaining terminal 4*a*, and simultaneously, makes the logic of the data retained in the second data retaining terminal 3*b* identical to the logic of the data retained in the fourth data retaining terminal 4*b*.

Then, in the states A, the controller 8 turns on the first switching circuit 6 using the respective control signals S1 (S1="H").

Even when, for example, radiation enters the first data retaining terminal 3*a* and charges are induced in S1="H" by the radiation, the slave latch circuit 4 operates so as to rewrite the data of the master latch circuit 3 with the master latch data saved in the slave circuit 4. For this reason, inversion of the data of the master latch circuit 3 due to the radiation can be suppressed.

Consequently, the semiconductor integrated circuit 100 can improve the soft error resistance of the flip-flop 10.

After that, when clock signal CLK1, control signals S1, and S3 are set to "L", master latch circuit 3 inputs the next data from data terminal 1, and slave latch circuit 4 outputs the data.

Additionally, though in this embodiment after control signal S3 is set to "H", first switching circuit 6 and second switching circuit 7 are turned on by control signal S1, it is possible to turn on these switching circuits simultaneously when control signal S3 is set to "H", or turn on these switching circuits before setting control signal S3 to "H".

As mentioned above, with the semiconductor integrated circuit according to the present embodiment, the soft error resistance of a flip-flop can be improved.

Embodiment 6

In Embodiment 6, description will be given of yet another example of specific circuit configurations of the master latch circuit 3, the slave latch circuit 4, and the clock signal generating circuit 5 of the semiconductor integrated circuit 100 shown in FIG. 2.

Figure 10:
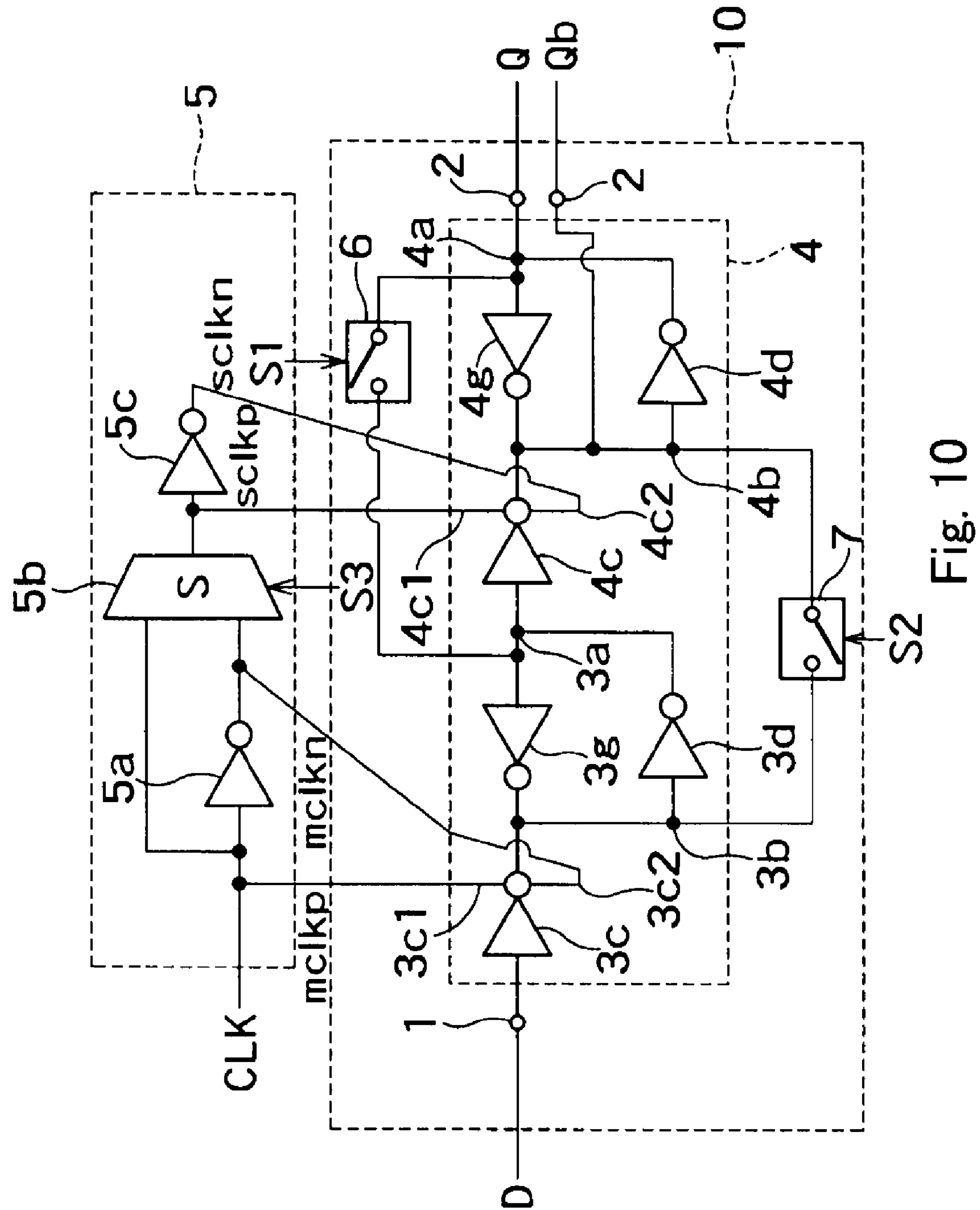
FIG. 10 is a circuit diagram of the master latch circuit, the slave latch circuit, and the clock signal generating circuit, which are shown in FIG. 2.

FIG. 10 is a diagram showing an example of specific circuit configurations of the master latch circuit 3, the slave latch circuit 4, and the clock signal generating circuit 5, which are shown in FIG. 2. In FIG. 10, the clock signal generating circuit 5 has the same configuration as that in FIG. 6A.

As shown in FIG. 10, the master latch circuit 3 includes the first data retaining terminal 3*a*, the second data retaining terminal 3*b*, a clocked inverter 3*c*, an inverter 3*d*, and an inverter 3*g*. In comparison with the master latch circuit 3 of FIG. 6A, the master latch circuit 3 of FIG. 10 has the same configuration as that of FIG. 6A except that the clocked inverter 3*e* is replaced with the inverter 3*g*.

The slave latch circuit 4 includes the third data retaining terminal 4*a*, the fourth data retaining terminal 4*b*, a clocked inverter 4*c*, an inverter 4*d*, and an inverter 4*g*. In comparison with the slave latch circuit 4 of FIG. 6A, the slave latch circuit 3 of FIG. 10 has the same configuration as that of FIG. 6A except that a clocked inverter 4*e* is replaced with the inverter 4*g*.

Here, the normal operation and the operation to improve the soft error resistance by the semiconductor integrated circuit 100 having the above-mentioned configuration is the same as the operation of the semiconductor integrated circuit 100 of Embodiment 2.

In other words, the operation of the semiconductor integrated circuit 100 improves the soft error resistance in the same manner as in the case of Embodiment 2.

Specifically, even when, for example, radiation enters the data retaining terminal 3*a* and charges are induced by the radiation, the slave latch circuit 4 operates so as to rewrite the data of the master latch circuit 3. For this reason, inversion of the data of the master latch circuit 3 due to the radiation can be suppressed.

Consequently, the semiconductor integrated circuit 100 can improve the soft error resistance of the flip-flop 10.

As mentioned above, with the semiconductor integrated circuit according to the present embodiment, the soft error resistance of a flip-flop can be improved.

Embodiment 7

In Embodiment 7, description will be given of another example of specific circuit configurations of the master latch circuit 3, the slave latch circuit 4, and the clock signal generating circuit 5 in the semiconductor integrated circuit 200 shown in FIG. 4. In other words, a configuration in which the second switching circuit 7 is omitted will be described.

Figure 11:
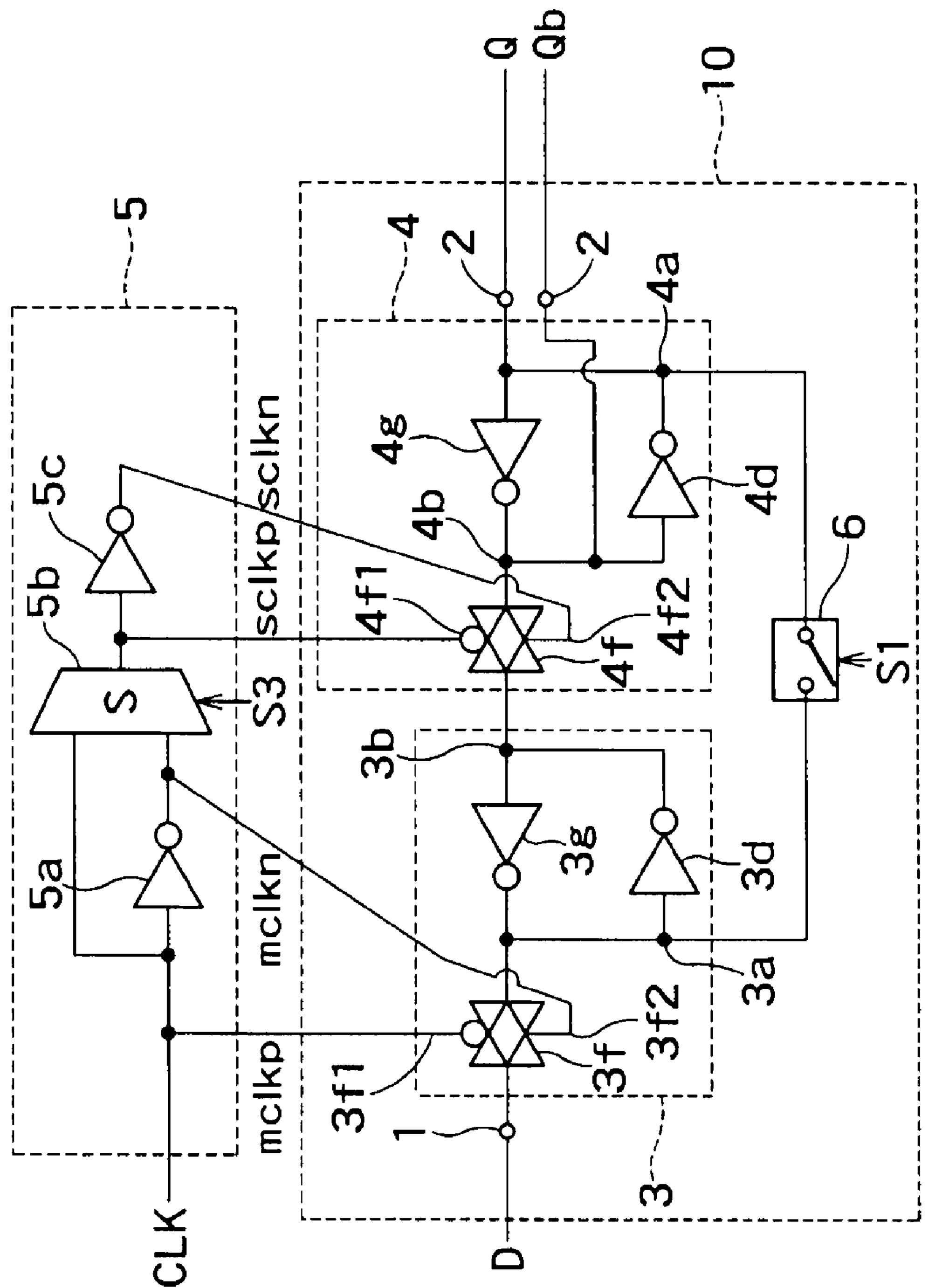
FIG. 11 is a circuit diagram of the master latch circuit, the slave latch circuit, and the clock signal generating circuit, which are shown in FIG. 4.

FIG. 11 is a diagram showing an example of specific circuit configurations of the master latch circuit 3, the slave latch circuit 4, and the clock signal generating circuit 5, which are shown in FIG. 4. In FIG. 11, the clock signal generating circuit 5 has the same configuration as that in FIG. 8.

As shown in FIG. 11, the master latch circuit 3 includes the data retaining terminal 3*a*, the data retaining terminal 3*b*, a transmission gate 3*f*, an inverter 3*d*, and an inverter 3*g*. In comparison with the master latch circuit 3 of FIG. 8, the master latch circuit 3 of FIG. 11 has the same configuration as that of FIG. 8 except that the clocked inverter 3*e* is replaced with the inverter 3*g*.

The slave latch circuit 4 includes the data retaining terminal 4*a*, the data retaining terminal 4*b*, a transmission gate 4*f*, an inverter 4*d*, and an inverter 4*g*. In comparison with the slave latch circuit 4 of FIG. 8, the slave latch circuit 4 of FIG. 11 has the same configuration as that of FIG. 8 except that the clocked inverter 4*e* is replaced with the inverter 4*g*.

Here, the normal operation and operation to improve the soft error resistance by the semiconductor integrated circuit 200 having the above-mentioned configuration is the same as the operation of the semiconductor integrated circuit 200 of Embodiment 5.

In other words, the operation of the semiconductor integrated circuit 200 improves the soft error resistance in the same manner as in the case of Embodiment 5.

Specifically, even when, for example, radiation enters the data retaining terminal 3*a* and charges are induced by the radiation, the slave latch circuit 4 operates so as to rewrite the data of the master latch circuit 3. For this reason, inversion of the data of the master latch circuit 3 due to the radiation can be suppressed.

Consequently, the semiconductor integrated circuit 200 can improve the soft error resistance of the flip-flop 10.

As mentioned above, with the semiconductor integrated circuit according to the present embodiment, the soft error resistance of a flip-flop can be improved.

While the invention is subject to various modifications and alternative forms, specific embodiments thereof are shown by way of embodiments in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

What is claimed is:

1. A semiconductor integrated circuit comprising:

a data input terminal;

a data output terminal;

a master latch circuit having an input terminal connected to the data input terminal, a first data retaining terminal to retain logic of data inputted through the data input terminal, and a second data retaining terminal to retain inverted logic of the logic retained in the first data retaining terminal;

a slave latch circuit having an input connected to an output terminal of the master latch circuit, an output terminal connected to the data output terminal, a third data retaining terminal to retain logic of the data inputted from the master latch circuit, and a fourth data retaining terminal to retain inverted logic of the logic retained in the third data retaining terminal;

a clock signal generating circuit that generates and outputs a first clock signal to control operation of the master latch circuit and a second clock signal to control operation of the slave latch circuit;

a first switching circuit connected between the first data retaining terminal and the third data retaining terminal;

a controller that controls the clock signal generating circuit and the first switching circuit, said controller configured to control the clock signal generating circuit control to output the first clock signal and the second clock signal with a timing so that the logic of the data retained in the first data retaining terminal becomes identical to the logic of the data retained in the third data retaining terminal, and then to turn on the first switching circuit; and a second switching circuit connected between the second data retaining terminal and the fourth data retaining terminal, and controlled by the controller, wherein the controller is configured to control the clock signal generating circuit control to output the first clock signal and the second clock signal with a timing so that the logic of the data retained in the first data retaining terminal becomes identical to the logic of the data retained in the third data retaining terminal, and simultaneously, the logic of the data retained in the second data retaining terminal becomes identical to the logic of the data retained in the fourth data retaining terminal, and the controller then turns on the first switching circuit and the second switching circuit.

2. The semiconductor integrated circuit according to claim 1, wherein after the slave latch circuit retains the data retained in the master latch circuit or the slave latch circuit passes the data to the data output terminal, the first switching circuit and the second switching circuit are turned on.

3. A semiconductor integrated circuit comprising:
a data input terminal;
a data output terminal;
a master latch circuit having an input terminal connected to the data input terminal, a first data retaining terminal to retain logic of data inputted through the data input terminal, and a second data retaining terminal to retain inverted logic of the logic retained in the first data retaining terminal;
a slave latch circuit having an input connected to an output terminal of the master latch circuit, an output terminal connected to the data output terminal, a third data retaining terminal to retain logic of the data inputted from the master latch circuit, and a fourth data retaining terminal to retain inverted logic of the logic retained in the third data retaining terminal;
a clock signal generating circuit that generates and outputs a first clock signal to control operation of the master latch circuit and a second clock signal to control operation of the slave latch circuit;
a first switching circuit connected between the first data retaining terminal and the third data retaining terminal;
a controller that controls the clock signal generating circuit and the first switching circuit, said controller configured to control the clock signal generating circuit control to output the first clock signal and the second clock signal with a timing so that the logic of the data retained in the first data retaining terminal becomes identical to the logic of the data retained in the third data retaining terminal, and then to turn on the first switching circuit; and
wherein:
the master latch circuit comprises;
a first clocked inverter having an input terminal connected to the data input terminal, an output terminal connected to the second data retaining terminal, a first clock terminal into which the first clock signal is inputted, and a second clock terminal into which a clock signal of a phase opposite to that of the first clock signal is inputted,
a first inverter having an input terminal connected to the second data retaining terminal, an output terminal connected to the first data retaining terminal, and
a second clocked inverter having an input terminal connected to the first data retaining terminal, an output terminal connected to the second data retaining terminal, a third clock terminal into which the clock signal of the phase opposite to that of the first clock signal is inputted, and a fourth clock terminal into which the first clock signal is inputted; and
the slave latch circuit comprises;
a third clocked inverter having an input terminal connected to the first data retaining terminal of the master latch circuit, an output terminal connected to the fourth data retaining terminal, a fifth clock terminal into which the second clock signal is inputted, and a sixth clock terminal into which a clock signal of a phase opposite to that of the second clock signal is inputted,
a second inverter having an input terminal connected to the fourth data retaining terminal, an output terminal connected to the third data retaining terminal, and
a fourth clocked inverter having an input terminal is connected to the third data retaining terminal, an output terminal connected to the fourth data retaining terminal, a seventh clock terminal into which the clock signal of the phase opposite to that of the second clock signal is inputted, and an eighth clock terminal into which the second clock signal is inputted.

4. A semiconductor integrated circuit comprising:
a data input terminal;
a data output terminal;
a master latch circuit having an input terminal connected to the data input terminal, a first data retaining terminal to retain logic of data inputted through the data input terminal, and a second data retaining terminal to retain inverted logic of the logic retained in the first data retaining terminal;
a slave latch circuit having an input connected to an output terminal of the master latch circuit, an output terminal connected to the data output terminal, a third data retaining terminal to retain logic of the data inputted from the master latch circuit, and a fourth data retaining terminal to retain inverted logic of the logic retained in the third data retaining terminal;
a clock signal generating circuit that generates and outputs a first clock signal to control operation of the master latch circuit and a second clock signal to control operation of the slave latch circuit;
a first switching circuit connected between the first data retaining terminal and the third data retaining terminal;
a controller that controls the clock signal generating circuit and the first switching circuit, said controller configured to control the clock signal generating circuit control to output the first clock signal and the second clock signal with a timing so that the logic of the data retained in the first data retaining terminal becomes identical to the logic of the data retained in the third data retaining terminal, and then to turn on the first switching circuit; and
wherein the clock signal generating circuit comprises,
a first inverter inputting the first signal clock,
a selector inputting the first signal clock and an output signal of the first inverter, and outputting the second clock signal, and
a second inverter inputting the second clock signal.

5. A semiconductor integrated circuit comprising:
a data input terminal;
a data output terminal;
a master latch circuit having an input terminal connected to the data input terminal, a first data retaining terminal to retain logic of data inputted through the data input terminal, and a second data retaining terminal to retain inverted logic of the logic retained in the first data retaining terminal, the master latch circuit comprising,
a first clocked inverter having an input terminal connected to the data input terminal, an output terminal connected to the second data retaining terminal, a first clock terminal into which the first clock signal is inputted, and a second clock terminal into which a clock signal of a phase opposite to that of the first clock signal is inputted,
a first inverter having an input terminal connected to the second data retaining terminal , and an output terminal connected to the first data retaining terminal, and
a second clocked inverter having an input terminal connected to the first data retaining terminal, an output terminal connected to the second data retaining terminal, a third clock terminal into which the clock signal of the phase opposite to that of the first clock signal is inputted, and a fourth clock terminal into which the first clock signal is inputted;

a slave latch circuit having an input terminal connected to an output of the master latch circuit, an output terminal connected to the data output terminal, a third data retaining terminal for retaining logic of the data inputted from the master latch circuit, and a fourth data retaining terminal for retaining inverted logic of the logic retained in the third data retaining terminal, the slave latch circuit comprising, a third clocked inverter having an input terminal connected to the first data retaining terminal of the master latch circuit, an output terminal connected to the fourth data retaining terminal, a fifth clock terminal into which the second clock signal is inputted, and a sixth clock terminal into which a clock signal of a phase opposite to that of the second clock signal is inputted, a second inverter having an input terminal connected to the fourth data retaining terminal, and an output terminal connected to the third data retaining terminal, and a fourth clocked inverter having an input terminal connected to the third data retaining terminal, an output terminal connected to the fourth data retaining terminal, a seventh clock terminal into which the clock signal of the phase opposite to that of the second clock signal is inputted, and an eighth clock terminal into which the second clock signal is inputted;

a clock signal generating circuit that generates and outputs a first clock signal for controlling operation of the master latch circuit and a second clock signal for controlling operation of the slave latch circuit;

a switching circuit connected between the second data retaining terminal and the fourth data retaining terminal; and a controller that controls the clock signal generating circuit and the switching circuit, wherein the controller is configured to control the clock signal generating circuit control to output the first clock signal and the second clock signal with a timing so that the logic of the data retained in the second data retaining terminal becomes identical to the logic of the data retained in the fourth data retaining terminal, and then to turn on the switching circuit.

6. The semiconductor integrated circuit according to claim 5, wherein:

the master latch circuit comprises;

a first transmission gate having an input terminal connected to the data input terminal, an output terminal connected to the first data retaining terminal, a first inverted clock terminal into which the first clock signal is inputted, and a first non-inverted clock terminal into which a clock signal of a phase opposite to that of the first clock signal is inputted, a first inverter having an input terminal connected to the first data retaining terminal, and an output terminal connected to the second data retaining terminal, and a first clocked inverter having an input terminal connected to the second data retaining terminal, an output terminal connected to the first data retaining terminal, a first clock terminal into which the clock signal of the phase opposite to that of the first clock signal is inputted, and a second clock terminal into which the first clock signal is inputted; and the slave latch circuit comprises;

a second transmission gate having an input terminal connected to the second data retaining terminal of the master latch circuit, an output terminal connected to the fourth data retaining terminal, a second inverted clock terminal into which the second clock signal is inputted, and a second non-inverted clock terminal into which a clock signal of a phase opposite to that of the second clock signal is inputted, a second inverter having an input terminal connected to the fourth data retaining terminal, and an output terminal connected to the third data retaining terminal, and a second clocked inverter having an input terminal connected to the third data retaining terminal, an output terminal connected to the fourth data retaining terminal, a third clock terminal into which the clock signal of the phase opposite to that of the second clock signal is inputted, and a fourth clock terminal into which the second clock signal is inputted.

7. The semiconductor integrated circuit according to claim 5, wherein:

the master latch circuit comprises;

a first transmission gate having an input terminal connected to the data input terminal, an output terminal connected to the first data retaining terminal, a first inverted clock terminal into which the first clock signal is inputted, and a first non-inverted clock terminal into which a clock signal of a phase opposite to that of the first clock signal is inputted, a first inverter having an input terminal connected to the first data retaining terminal, and an output terminal connected to the second data retaining terminal, and a first clocked inverter having an input terminal connected to the second data retaining terminal, an output terminal connected to the first data retaining terminal, a first clock terminal into which the clock signal of the phase opposite to that of the first clock signal is inputted, and a second clock terminal into which the first clock signal is inputted; and the slave latch circuit comprises;

a second transmission gate having an input terminal connected to the second data retaining terminal of the master latch circuit, an output terminal connected to the fourth data retaining terminal, a second inverted clock terminal into which the clock signal of the phase opposite to that of the first clock signal is inputted, and a second non-inverted clock terminal into which the first clock signal is inputted, a second inverter having an input terminal connected to the fourth data retaining terminal, and an output terminal connected to the third data retaining terminal, and a second clocked inverter having an input terminal connected to the third data retaining terminal, an output terminal connected to the fourth data retaining terminal, a third clock terminal into which the clock signal of the phase opposite to that of the second clock signal is inputted, and a fourth clock terminal into which the second clock signal is inputted.

8. The semiconductor integrated circuit according to claim 5, wherein:

the master latch circuit comprises;

a first clocked inverter having an input terminal connected to the data input terminal, an output terminal connected to the second data retaining terminal, a first clock terminal into which the first clock signal is inputted, and a second clock terminal into which a clock signal of a phase opposite to that of the first clock signal is inputted, a first inverter having an input terminal connected to the second data retaining terminal, and an output terminal connected to the first data retaining terminal, and a second inverter having an input terminal connected to the first data retaining terminal, and an output terminal connected to the second data retaining terminal; and the slave latch circuit comprises;

a third clocked inverter having an input terminal connected to the first data retaining terminal of the master latch circuit, an output terminal connected to the fourth data retaining terminal, a fifth clock terminal into which the second clock signal is inputted, and a sixth clock terminal into which a clock signal of a phase opposite to that of the second clock signal is inputted, a third inverter having an input terminal connected to the fourth data retaining terminal, and an output terminal connected to the third data retaining terminal, and a fourth inverter having an input terminal connected to the third data retaining terminal, and an output terminal connected to the fourth data retaining terminal.

9. The semiconductor integrated circuit according to claim 5, wherein:

the master latch circuit comprises;

a first transmission gate having an input terminal connected to the data input terminal, an output terminal connected to the first data retaining terminal, a first inverted clock terminal into which the first clock signal is inputted, and a first non-inverted clock terminal into which a clock signal of a phase opposite to that of the first clock signal is inputted, a first inverter having an input terminal connected to the first data retaining terminal, and an output terminal connected to the second data retaining terminal, and a second inverter having an input terminal connected to the second data retaining terminal, and an output terminal connected to the first data retaining terminal; and the slave latch circuit comprises;

a second transmission gate having an input terminal connected to the second data retaining terminal of the master latch circuit , an output terminal connected to the fourth data retaining terminal, a second inverted clock terminal into which the second clock signal is inputted, and a second non-inverted clock terminal into which a clock signal of a phase opposite to that of the second clock signal is inputted, a third inverter having an input terminal connected to the fourth data retaining terminal, and an output terminal connected to the third data retaining terminal, and a fourth inverter having an input terminal connected to the third data retaining terminal, and an output terminal connected to the fourth data retaining terminal.

10. The semiconductor integrated circuit according to claim 5, wherein the clock signal generating circuit comprises:

a first inverter inputting the first signal clock;

a selector inputting the first signal clock and an output signal of the first inverter, and outputting the second clock signal; and a second inverter inputting the second clock signal.

11. The semiconductor integrated circuit according to claim 5, wherein after the slave latch circuit retains the data retained in the master latch circuit or the slave latch circuit passes the data, which is retained in the master latch circuit and is inputted from the master latch circuit, to the data output terminal, the switching circuit is turned on.

* * * * *